United States Patent [19]

Pecukonis

[11] Patent Number: 4,775,832
[45] Date of Patent: Oct. 4, 1988

[54] CONDUCTOR TRACER TRANSMITTER WITH NON-REVERSING MAGNETIC FIELD TRACING SIGNAL

[75] Inventor: Joseph P. Pecukonis, Littleton, Colo.
[73] Assignee: Pasar, Inc., Denver, Colo.
[21] Appl. No.: 12,742
[22] Filed: Feb. 9, 1987
[51] Int. Cl.[4] .................. G01R 19/15; G01R 31/28; G01V 3/11
[52] U.S. Cl. ........................................ 324/67; 324/529
[58] Field of Search ............... 324/66, 67, 508, 521, 324/527–529, 326

[56] References Cited
U.S. PATENT DOCUMENTS
4,491,785  1/1985  Pecukonis ........................... 324/67

Primary Examiner—Gerard R. Strecker
Attorney, Agent, or Firm—John R. Ley

[57] ABSTRACT

A conductor tracer which is used to trace and identify a conductor energized by an AC energizing signal includes an improved transmitter by which to draw a current tracing signal from the energized conductor. The current tracing signal is phase shifted by 180° upon the occurrence of each subsequent half cycle of the AC energizing signal. By phase shifting the current tracing signal when the direction of current flow in the conductor reverses due to the change in polarity of the AC energizing signal, the net effect is that a uniform phase or polarity magnetic field tracing signal about the conductor is maintained. The uniform phase or polarity magnetic field tracing signal makes detection of the conductor more reliable and easily accomplished.

19 Claims, 4 Drawing Sheets

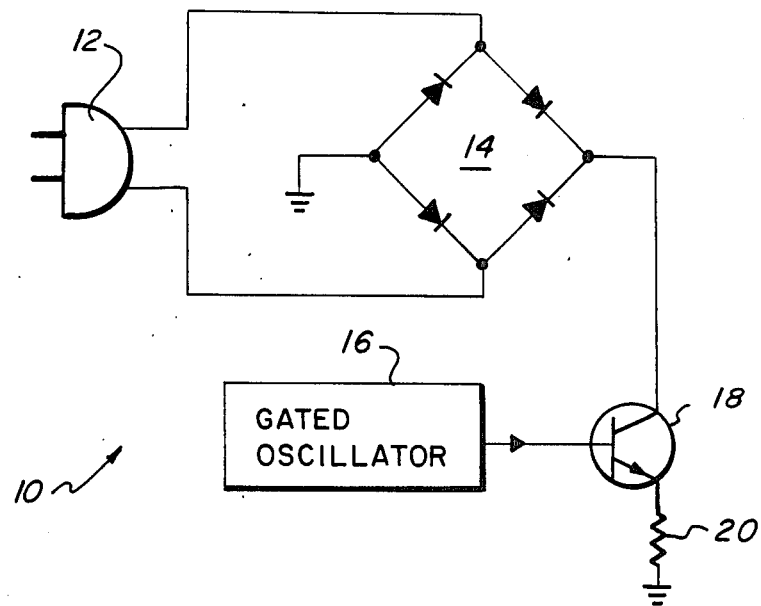
SIMPLIFIED TRANSMITTER
Fig_1
PRIOR ART
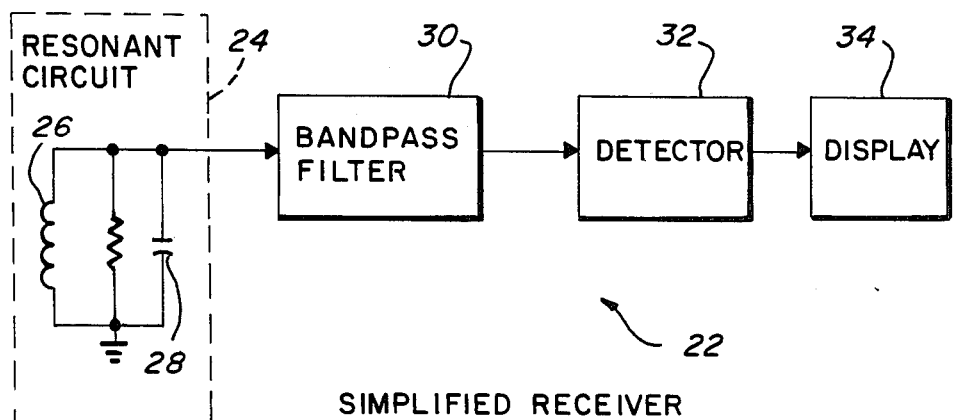
SIMPLIFIED RECEIVER
Fig_3
PRIOR ART

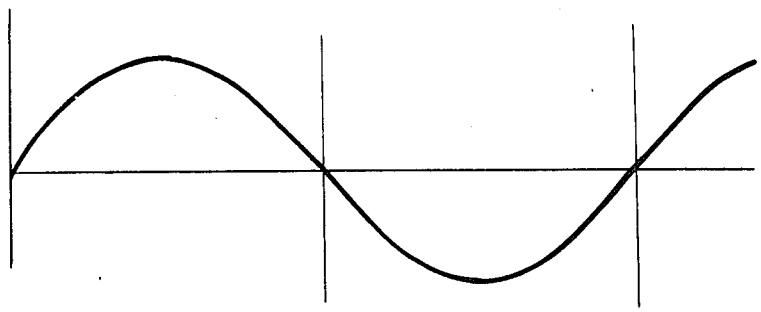
Fig_2A
PRIOR ART
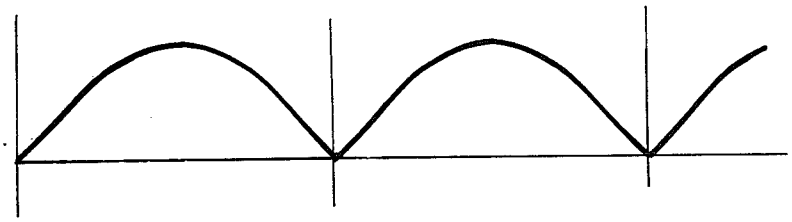
Fig_2B
PRIOR ART
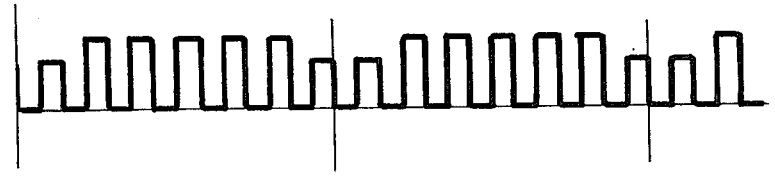
Fig_2C
PRIOR ART
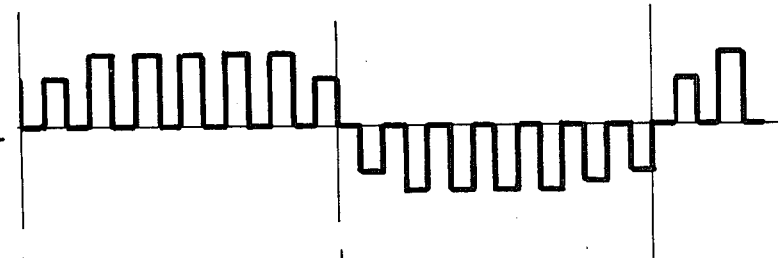
Fig_2D
PRIOR ART
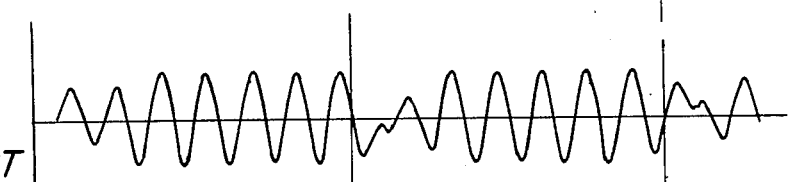
Fig_4A
PRIOR ART
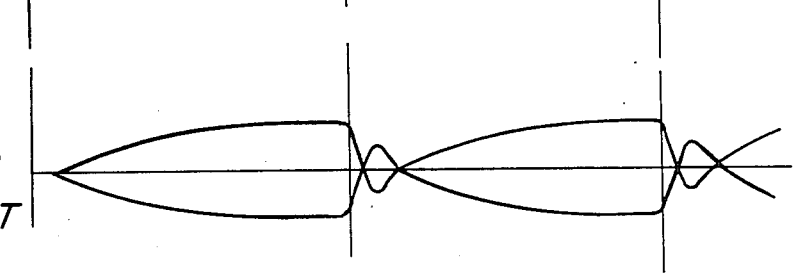
Fig_4B
PRIOR ART

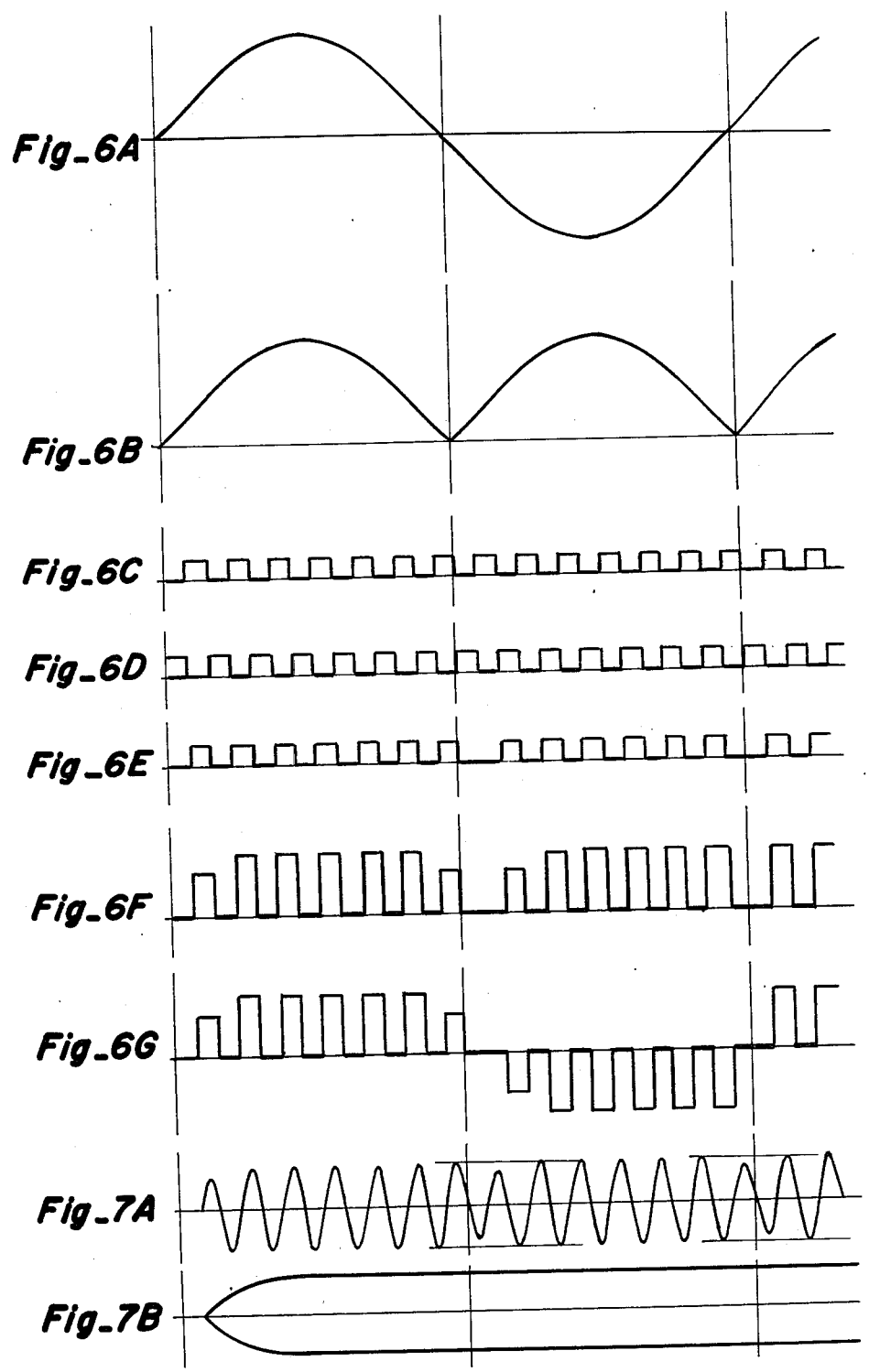

CONDUCTOR TRACER TRANSMITTER WITH NON-REVERSING MAGNETIC FIELD TRACING SIGNAL

The present invention relates to an apparatus for tracing and identifying electrical current carrying conductors which are energized by an alternating current (AC) power, such as conventional 50 or 60 hertz power. More particularly, the present invention relates to improvements in a transmitter of this type of conductor tracer apparatus, wherein the improvements maintain a uniform polarity electromagnetic or magnetic field tracing signal about the conductor during successive half cycles of the AC power, and prevent the adverse detection effects of field polarity reversals in the receiver of the circuit tracer apparatus.

CROSS REFERENCE TO RELATED APPLICATIONS

This invention is related to an invention described in a United States patent application for a Conductor Tracer Receiver with Immunity to Phase Reversals in the Transmitter Signal, Ser. No. 012,248, filed concurrently herewith. This application is also related to a United States patent application for a Conductor Tracer with Improved Current Regulating Transmitter, Ser. No. 012,244, filed concurrently herewith, and the disclosure thereof is incorporated herein by this reference. Both of these concurrently filed applications are assigned to the assignee of this invention.

BACKGROUND OF THE INVENTION

In a conductor tracer of the type disclosed in U.S. Pat. No. 4,491,785, a transmitter draws or absorbs a current tracing signal from a conductor energized by an AC power source. The current tracing signal creates a predetermined magnetic field tracing signal around the conductor. The magnetic field tracing signal has a strength characteristic which is directly related to the magnitude of the current tracing signal, and has polarity characteristic which is directly related to the direction of current flow in the conductor. A receiver of the conductor tracer detects the magnetic field tracing signal, and a display of the magnitude of the detected signal is used to distinguish the conductor carrying the current tracing signal from adjacent conductors which are not carrying the current tracing signal.

The magnetic field tracing signal is influenced by a number of factors. The relative voltage between the conductor and ground is constantly changing, and there is a tendency for the amount of current of the current tracing signal to correspondingly fluctuate. By maintaining the current tracing signal at a relatively constant magnitude independent of the voltage fluctuations, a relatively constant magnitude magnetic field tracing signal is created about the conductor. The relatively constant magnetic field tracing signal makes it easier to distinguish the conductor carrying the tracing signal from adjacent conductors. Approaches to regulating the amount of current drawn by the transmitter to create a generally uniform strength magnetic field tracing signal are disclosed in U.S. Pat. Nos. 4,491,785 and 4,642,556, and in the above mentioned application for Conductor Tracer with Improved Current Regulating Transmitter.

The relative polarity and current flow direction also changes with each successive half cycle of the AC energizing power. Due to the manner in which the current tracing signals have previously been applied to the conductor, the polarity of the magnetic field tracing signal reverses with each successive half cycle of AC energizing power. The constantly reversing polarity of the magnetic field tracing signal detracts from the ability of prior receivers to detect the magnitude of the magnetic field tracing signal. The prior art magnetic field tracing signal effects and the prior art conductor tracer transmitters and receivers are better understood by reference to FIGS. 1, 2A, 2B, 2C, 2D, 3, 4A and 4B.

Referring to FIG. 1, a simplified prior art conductor tracer transmitter 10 is connected through a power plug 12 to the conductor (not shown) which is to be traced and identified. The conductor is energized by the conventional AC sine wave power signal, which is shown in FIG. 2A. A full wave bridge rectifier 14 of the transmitter 10, shown in FIG. 1, rectifies the AC energizing signal to the full wave rectified form shown in FIG. 2B. A conventional gated oscillator 16 creates a series of trigger pulses which are applied to a power transistor 18. The transistor 18 is connected in an emitter follower arrangement through the resistor 20 connected to its emitter. The trigger pulses from the gated oscillator 16 occur at a predetermined high frequency and are gated on and off in a conventional duty cycle fashion. The transistor 18 conducts current pulses of approximately constant current from the bridge rectifier 14 through the resistor 20 in response to each constant magnitude trigger pulse from the oscillator 16.

The current pulses conducted from the rectified AC energizing signal are shown in FIG. 2C. All the pulses shown in FIG. 2C are of constant width and would be of constant height, and therefore constant energy content, except that slightly before and after the zero crossing points of the AC power signal and the rectified AC signal shown in FIGS. 2A and 2B respectively, an insufficient voltage exists on the conductor to conduct constant energy pulses. The pulses shown in FIG. 2C, are conducted from the conductor by the bridge rectifier 14 (FIG. 1) and appear on the conductor in the form of the current tracing signal shown in FIG. 2D. Stated another way, the current flow reverses on the conductor in successive half cycles, and FIG. 2D shows that the current pulses shown in FIG. 2C flow in opposite directions on the conductor during the positive and negative half cycles of the AC energizing signal. The magnetic field tracing signal about the conductor has one polarity during the positive half cycles of the AC power signal and has the opposite polarity during the negative half cycles of the AC power signal, because the direction of current flow on the conductor reverses.

The interval, time width, spacing and frequency of the pulses of the current tracing signal remain consistent during successive half cycles of the applied AC energizing signal, because such characteristics are established by the gated oscillator. Even though the characteristics of these pulses remain consistent, the reversal in the direction of current flow over the conductor during successive half cycles of the AC power signal has the effect of phase shifting the frequency component of the magnetic field and current tracing signals by 180° due to the current flow reversals.

The 180° phase shift during successive half cycles of the AC power creates difficulties in the detection of the magnetic field tracing signal as will be described in reference to the simplified conductor tracer receiver shown in FIG. 3. The receiver 22 includes a resonant circuit 24 which includes an inductor 26 and a capacitor 28. The components 26 and 28 are selected to establish their resonant frequency at approximately the same frequency of the high frequency component of the magnetic field and current tracing signals. The magnetic field tracing signal induces a signal in the inductor 26 when the receiver is brought into physical proximity with the conductor carrying the current tracing signal. The resonant circuit 24 starts ringing at its resonant frequency as is shown in FIG. 4A. The frequency is passed through a band pass filter 30 whose band pass frequency is also that frequency of the high frequency component of the tracing signal. The envelope of the signals passed through the filter is shown in FIG. 4B. A detector 32 of the receiver 22 rectifies the high frequency signal from the filter 30 and develops a signal representative of its magnitude during the on time of the duty cycle of the tracing signal. The magnitude of the detector signal is displayed at a display 34 of the receiver 22.

Once the resonant circuit 24 starts ringing, each cycle of the high frequency magnetic field tracing signal reinforces the ringing effect and the magnitude of the oscillating signal in the resonant circuit 24 builds. With the next successive half cycle of the AC energizing signal, the polarity of the magnetic field tracing signal reverses, and its high frequency component becomes 180° out of phase relative to the phase of the signal oscillating in the resonant circuit. As a consequence, the ringing in the resonant circuit 24 is no longer reinforced, but is quickly cancelled by the 180° phase reversal. The cancelling effect occurs rapidly after the polarity reversal, but nonetheless takes a finite amount of time. The effect is shown in FIG. 4A where the ringing frequency from the previous half cycle terminates and the ringing starts at the same frequency but phase shifted by 180° at the beginning of each successive half cycle of the AC energizing signal.

The effect of the phase reversal in the receiver 22 is illustrated in FIG. 4B. As soon as the phase reversal occurs, the signal in the resonant circuit 24, filter 30 and detector 32 must first collapse, and thereafter build up again in the resonant circuit in response to the phase reversal of the high frequency component of the magnetic field tracing signal. During this collapse-and-buildup time period, the display 34 provides an uncertain indication, the filter 30 must respond to the new phase relationship, and the detector 32 must dissipate at least a portion of its prior level and establish a new level. The effect of the phase reversals is therefore to inhibit the ability of the receiver, and the user, to distinguish between adjacent conductors, because a constant polarity magnetic field tracing signal is not present on the conductor.

One solution to the prior problems of phase reversals in conductor tracers is described in the U.S. patent application for a Conductor Tracer Receiver with Immunity Phase Reversals in the Transmitter Signal. Another solution to these problems is described below.

BRIEF SUMMARY OF THE INVENTION

The present invention has as its primary objective the elimination of the problems in prior conductor tracers associated with the polarity reversals in the magnetic field tracing signal, and instead, the creation of a magnetic tracing signal which maintains a constant polarity during the voltage polarity reversals occurring during successive half cycles of the AC energizing signal on the conductor to which the conductor tracer transmitter is connected.

In accordance with its major aspects, an improved current tracer transmitter of the present invention comprises means which responds to the occurrence of each half cycle of the AC power energizing signal on the conductor to phase shift the current tracing signal by 180° upon the occurrence of each successive half cycle of the AC energizing signal. By shifting the phase of the current tracing signal by 180° in response to the change in direction of current flow on the conductor, the net effect is the maintenance of the uniform phase or polarity of the magnetic field tracing signal on the conductor created by the current tracing signal.

Phase shifting the current tracing signal upon the occurrence of each half cycle of the AC energizing signal preferably involves generating a first trigger signal, generating a second trigger signal which is phase shifted by 180° with respect to the first trigger signal, sensing the occurrence of each half cycle of the AC energizing signal, and selecting between the first and second trigger signals in accordance with the sensed half cycles of the AC energizing signal. The trigger signal is employed to operatively connect and disconnect a load, preferably a current regulator, from the energized conductor. When the load is connected the current tracing signal is drawn in the conductor.

The actual scope of the invention is defined by the appended claims but has been generally summarized above. A preferred embodiment of the present invention, and a better understanding of the invention itself, is presented in the following detailed description of a preferred embodiment and in the accompanying drawings which are next briefly described.

BRIEF DESCRIPTION OF THE DRAWINGS

FIG. 1 is a schematic and block diagram of a simplified version of a prior art transmitter of a conductor tracer apparatus.

FIGS. 2A, 2B, 2C and 2D are prior art wave form diagrams which respectively illustrate an AC power energizing signal present on the conductor to which the transmitter shown in FIG. 1 is attached, the rectified power energizing signal present in the transmitter shown in FIG. 1, the current pulses absorbed by the transmitter shown in FIG. 1, and the current tracing signal present on the conductor to which the transmitter of FIG. 1 is connected.

FIG. 3 is a schematic and block diagram of a simplified version of a prior art receiver of a conductor tracing apparatus. This type of receiver is also used in conjunction with the improved transmitter of the present invention.

FIGS. 4A and 4B are wave form diagrams which respectively illustrate the signals present in a resonant circuit and the envelope of the signals present at the output terminal of a band pass filter of the receiver shown in FIG. 3.

FIGS. 6A and 6B are wave form diagrams which respectively illustrate an AC power signal present on the conductor to which the transmitter of FIG. 5 is attached, and the rectified energizing signal present in the transmitter shown in FIG. 5. FIGS. 6C, 6D, 6E and 6F are wave form diagrams which are present at points, in the circuit of the transmitter shown in FIG. 5. FIG. 6G is a wave form diagram which represents the current tracing signal applied to the conductor by the transmitter shown in FIG. 5.

FIGS. 7A and 7B are wave form diagrams which respectively illustrate the signal present in the resonant circuit and the envelope of the signal present at the output of the band pass filter of a receiver such as that shown in FIG. 3, in response to a current tracing signal created by the transmitter shown in FIG. 5.

Figure 5:
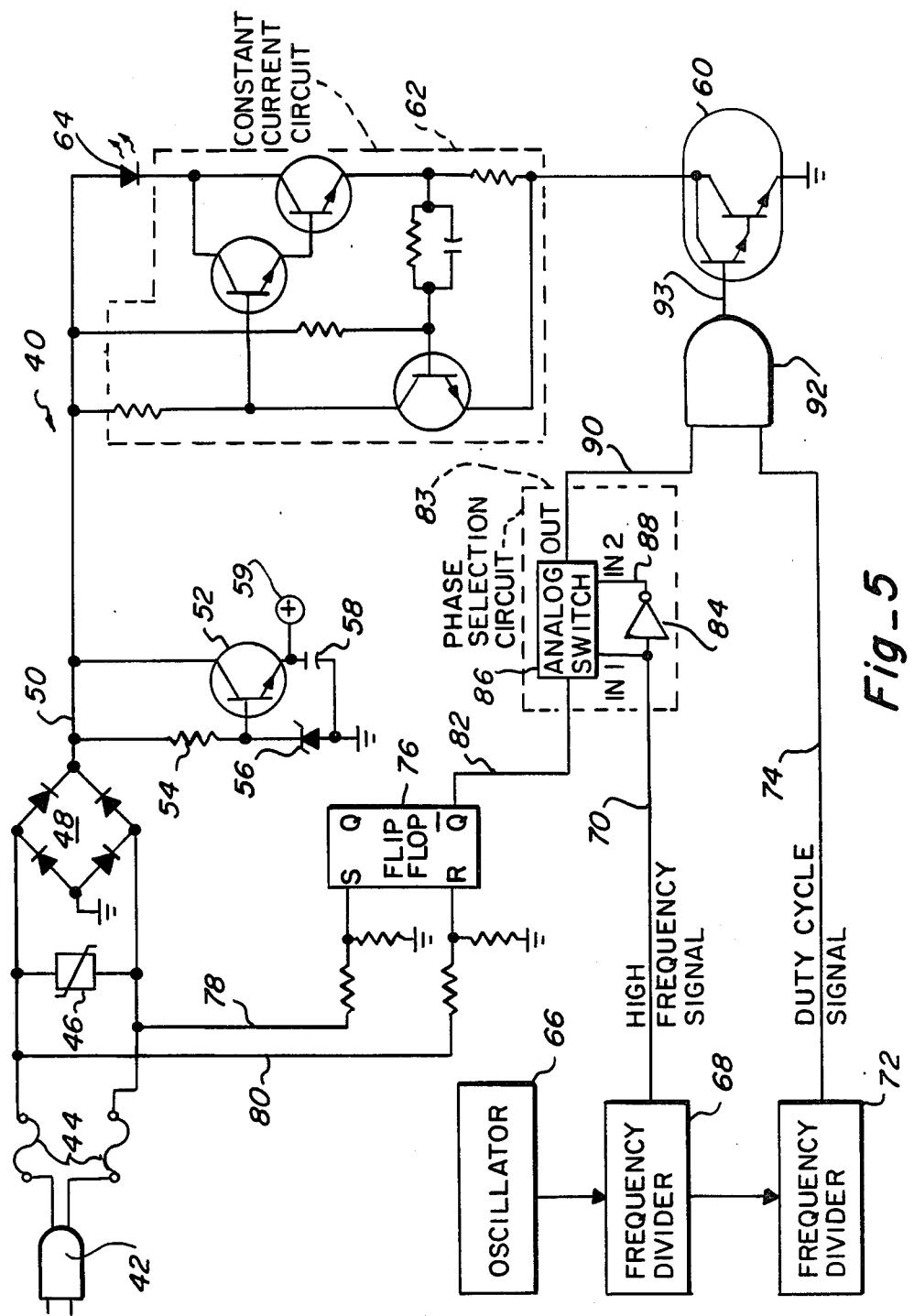
FIG. 5 is a schematic and block diagram of the improved transmitter of the present invention.

The wave form diagrams shown in the drawings occupy the same time reference axis and are shown in a consistent time relationship from one Figure to another for comparison purposes.

DETAILED DESCRIPTION

The improved conductor tracer transmitter 40 of the present invention is illustrated in FIG. 5. The transmitter is connected by a power plug 42 to the electrical conductor (not shown) which is to be traced and identified. A pair of fuses 44 protect the transmitter 40 against high current conditions, and a varistor 46 protects the transmitter against over-voltage conditions. A full wave rectifier 48 rectifies the AC energizing signal (FIG. 6A) present at the power plug 42 to a full wave rectified form (FIG. 6B) and presents the full wave rectified signal on conductor 50.

A transistor 52, and its associated resistor 54, Zener diode 56 and capacitor 58 are connected to the conductor 50 in a conventional manner and operatively derive a supply of regulated low voltage DC power at 59 for energizing the digital and other circuit elements of the transmitter 40 which require such a low voltage power supply.

A power switching transistor 60 operatively conducts current from the conductor 50 through a constant current circuit 62 and a light emitting diode (LED) 64. As will be described subsequently, the transistor 60 is triggered on and off by triggering pulses occurring at the predetermined high frequency of the current tracing signal. When the transistor 60 is turned on, the constant current circuit 62 conducts a constant current from the conductor 50 to ground through the transistor 60. The constant current circuit 62 achieves improvements in regulating the amount of current drawn from the conductor by the transmitter, and is described in greater detail in the previously mentioned co-pending United States patent application for a Conductor Tracer with Improved Current Regulating Transmitter. When the LED 64 emits light, the user knows that the transmitter 40 is operating. The constant current conducted through the circuit 62 by the transistor 60 creates the current tracing signal which is conducted over the conductor to which the transmitter 40 is connected.

The triggering pulses or signals for the transistor 60 originate from an oscillator 66. The output signal from the oscillator 66 is applied to a first frequency divider 68. The frequency divider 68 divides the oscillator frequency by predetermined factor and supplies a high frequency signal on conductor 70 which occurs at the frequency of the high frequency component of the transmitter signal. The frequency divider 68 also supplies an output signal to a second frequency divider 72. The input signal to the frequency divider 72 is divided by a predetermined factor and supplies a duty cycle signal on conductor 74. The signal on conductor 74 defines the duty cycle of the transmitter signal. During the on time of the duty cycle, the transistor 60 is triggered on and off. During the off time of the duty cycle signal on conductor 74, the transistor 60 is in a non-conductive or off state. Effects during the on time of the duty cycle are illustrated in the drawings; the off time effects are not illustrated.

In order to sense the phase of each half cycle of the applied AC energizing signal, means such as a flip-flop 76 is employed. The set (S) input terminal of the flip-flop 76 is connected by a conductor 78 to one of the conductors connected to the power plug 42. The reset (R) input terminal of the flip-flop 76 is connected by another conductor 80 to the other conductor connected to the power plug 42. When the voltage on conductor 78 is positive relative to conductor 80 during one half cycle of the applied AC power, a positive signal is applied to the set input terminal of the flip-flop 76, and a high output signal is present at the "Q" output terminal of the flip-flop 76. The high output signal from the Q output terminal is not utilized. On the other hand, when the voltage on conductor 80 is positive on conductor 80 relative to conductor 78 during the other or next successive half cycle of applied AC power, a positive signal is applied to the reset terminal of flip-flop 76, and a high signal is applied at the "not Q" output terminal from the flip-flop 76. Appropriate circuit arrangements are employed to prevent the effects of the simultaneous application of high level signals to both the set and reset input terminals. Triggering the flip-flop 76 in response to every successive half cycle of the applied AC energizing signal causes the flip-flop to reliably change states with each half cycle. Thus, a positive signal is present at conductor 82 whenever the conductor 80 is positive with respect to the conductor 78 during every other successive half cycle of the applied AC energizing signal, and a low level or zero level signal occurs on conductor 82 during the other half cycles.

In order to eliminate the detrimental phase reversal effects of prior art conductor tracer transmitters described previously, means such as a phase selection circuit 83 is used to select one of two 180° phase shifted trigger signals which is to be supplied to the transistor 60 during the on time of the duty cycle. The phase selection circuit 83 includes an inverter 84 and a conventional analog switch 86. Two input signals are applied to the analog switch 86. One of the input signals is the high frequency transmitter signal present on conductor 70, and the other input signal is present on conductor 88. Due to the effects of the inverter 84 the signal on conductor 88 is inverted or phase shifted 180° compared to the signal on conductor 70. FIG. 6C illustrates the high frequency signal present on conductor 70, and FIG. 6D illustrates the inversion of this signal on conductor 88. The analog switch 86 selects between the two input signals on conductors 70 and 88 in accordance with the presence and absence of a high signal on conductor 82. When the signal on conductor 80 is positive, during positive half cycles of the applied AC energizing signal, the signal on conductor 82 is high and the analog switch 86 applies the signal on conductor 70 (FIG. 6C) as the output signal on conductor 90. When the signal on conductor 78 is positive during negative half cycles of the applied AC energizing signal, and the signal on conductor 82 is low, the analog switch 86 applies the signal on conductor 88 (FIG. 6D) as the output signal on conductor 90. The signal on conductor 90 is illustrated at FIG. 6E.

An AND gate 92 logically combines the signals on conductors 74 and 90 to provide the trigger signal on conductor 93 for the transistor 60. The signal on conductor 90 (FIG. 6E) becomes the triggering signal for the transistor 60 during the on time of the duty cycle established by the duty cycle control signal on conductor 74. Of course during the off time of the duty cycle when the signal on conductor 74 is low, the output signal from the AND gate 90 is in a low state and the transistor 60 is non-conductive.

FIG. 6F illustrates the current pulses conducted at conductor 50 (FIG. 5) by the triggered transistor 60. FIG. 6G illustrates the current tracing signal conducted on the conductor to which the transmitter is connected as a result of the bridge rectifier 48 (FIG. 5). As can be seen by comparing FIGS. 6E, 6F and 6G, the transistor 60 (FIG. 5) is triggered on those high frequency signals which are phase shifted by 180° during the next successive half cycle relative to those pulses occurring at the high frequency rate during the previous half cycle of the applied AC energizing signal.

The effects of the current tracing signal shown in FIG. 6G on the resonant circuit of the receiver are illustrated in FIG. 7A. The receiver used in conjunction with the improved transmitter 40 can be a conventional prior art receiver as is illustrated in FIG. 3. The resonant circuit of the receiver starts ringing during the positive half cycle, and the ringing effect is reinforced by the in-phase positive and negative field effects from the magnetic field tracing signal. During the negative half cycle, the magnetic field tracing signal is reversed in polarity, but it is also phase shifted 180°. The net effect of the reverse polarity and the phase shifting is to cancel the individual effects of each, and the magnetic field tracing signal continues to reinforce the ringing effect in the resonant circuit of the receiver. Thus the ringing in the resonant circuit is not forced to collapse and to build up again with a wholly new signal which has been phase shifted 180° from the ringing signal occurring during the previous half cycle of the energizing signal. The envelope effect at the output of the band pass filter of the receiver is illustrated in FIG. 7B. Since the signal from the resonant circuit does not collapse and build back up, the output signal from the band pass filter remains approximately constant. The detector of the receiver detects a relatively constant magnitude signal and is not adversely influenced by the collapsing and building up which occurs during the phase reversals typical in prior art apparatus for tracing and identifying conductors.

The significant improvements available from the present invention have been shown and described with a degree of particularity. It should be understood, however, that the detailed description has been offered by way of a preferred example, and that the scope of the present invention is defined by the appended claims.

What is claimed is:

1. In a conductor tracer used to trace and idenify a conductor energized by an AC energizing signal, including transmitted means for connection to the conductor for drawing from the conductor a current tracing signal having regular periodic characteristics, an improvement in transmitter means comprising:

means for maintaining a uniform phase magnetic field tracing signal on the conductor during reversals in the direction of current flow of the current tracing signal with each successive half cycle of the AC energizing signal, said maintaining means comprising:

means electrically connected to the conductor and responsive to the occurrence of each half cycle of the AC energizing signal for phase shifting the current tracing signal drawn from the conductor by 180° upon the occurrence of each subsequent half cycle of the AC energizing signal on the conductor.

2. An invention as defined in claim 1 further comprising:

means for generating a trigger signal having a predetermined frequency and period;

means for phase shifting the trigger signal by 180° upon the occurrence of each successive half cycle of the AC energizing signal on the conductor; and switch means responsive to the trigger signal for connecting a load to the conductor by which to conduct the current tracing signal on the conductor as a consequence of the AC energizing signal, the switch means connecting the load to the conductor and disconnecting the load from the conductor during each period of the trigger signal.

3. An invention as defined in claim 2 wherein:

the trigger signal comprises a series of periodic pulses, one pulse occurring during each period of the trigger signal; and the switch means operatively connects the load to the conductor in response to each pulse of the trigger signal.

4. An invention as defined in claim 3 wherein the load includes means for regulating to a predetermined constant value the magnitude of the current of the current tracing signal drawn from the conductor.

5. An invention as defined in claim 3 wherein:

each pulse of the trigger signal occurs for approximately one-half of the time duration of each period of the trigger signal; and the switch means connects the load to the conductor for the duration of each pulse of the trigger signal.

6. An invention as defined in claim 1 wherein said means responsive to each half cycle of the AC energizing signal is responsive to the polarity of each half cycle of the AC energizing signal on the conductor.

7. In a conductor tracer used to trace and identify a conductor energized by an AC energizing signal, including transmitter means for connection to the conductor for drawing a current tracing signal from the conductor to thereby create a magnetic field tracing signal about the conductor by which to detect the conductor, and an improvement to said transmitter comprising:

means electrically connected to the conductor and responsive to the polarity of the AC energizing signal on the conductor for supplying a phase signal indicative of the polarity of each half cycle of the AC energizing signal;

means for generating a first trigger signal;

means for generating a second trigger signal which is phase shifted by 180° with respect to the first trigger signal;

selection means receptive of the phase signal and the first and second trigger signals and operative for supplying one of the first or second trigger signals as a driving trigger signal, said selection means supplying the first trigger signal as the driving trigger signal during each half cycle of the energizing signal of one polarity and for supplying the second trigger signal as the driving trigger signal during each other half cycle of the energizing signal of the other polarity; and means electrically connected to the conductor and receptive of the driving trigger signal for conducting the current tracing signal on the conductor in response to the driving trigger signal, the current tracing signal maintaining a uniform phase magnetic field about the conductor during reversals in polarity of the AC energizing signal on the conductor.

8. An invention as defined in claim 7 wherein:
the selection means comprises an analog switch means.

9. An invention as defined in claim 7 wherein:
the means for supplying the phase signal comprises means which is set on the occurrence of a half cycle of the AC energizing signal of one polarity and which is reset on the occurrence of a half cycle of the AC energizing signal of the other polarity and which supplies the phase signal of one state when set and supplies the phase signal of another state when reset.

10. An invention as defined in claim 9 wherein the selection means comprises an analog switch means responsive to the states of the phase signal for selecting one of the first or second trigger signals to supply as the driving trigger signal.

11. An invention as defined in claim 10 wherein:
each trigger signal is a series of periodic pulses occurring at a predetermined frequency, each pulse occurring for approximately one-half of the time duration of each period of the trigger signal; and
the means for conducting current from the conductor does so for the duration of each pulse of the driving trigger signal.

12. An invention as defined in claim 11 further comprising:
means for regulating to a predetermined constant value the magnitude of the current of the current tracing signal drawn from the conductor by the means for conducting current from the conductor.

13. An invention as defined in claim 11 wherein the means for generating the second trigger signal comprises:
inverter means receptive of the first trigger signal for inverting the first trigger signal to create the second trigger signal.

14. An invention as defined in claim 11 further comprising:
means for generating a periodic duty cycle signal, each period of the duty cycle signal having a predetermined on time and a predetermined off time; and
gate means receptive of the driving trigger signal and the duty cycle signal for conducting the driving trigger signal to the means for conducting the current from the conductor only during the on time of the duty cycle signal.

15. An invention as defined in claim 10 wherein the means which is set and reset comprises a flip-flop.

16. An invention as defined in claim 7 wherein the means for generating the second trigger signal comprises:
inverter means receptive of the first trigger signal for inverting the first trigger signal to create the second trigger signal.

17. An invention as defined in claim 7 further comprising:
rectifier means for electrically connecting the conductor to the means for conducting current from the conductor.

18. For use with an apparatus for tracing and identifying a conductor energized by an AC energizing signal, a method of preventing phase reversals in a magnetic field tracing signal on the conductor created by a corresponding current tracing signal conducted as a result of the conductor being energizing by an AC energizing signal, comprising the steps of:
creating the current tracing signal by periodically connecting in a predetermined regular relationship a predetermined load to the conductor energized by the AC energizing signal to draw a predetermined current from the conductor which flows in a direction related to the polarity of each half cycle of the AC energizing signal, the predetermined drawn current being the current tracing signal in the conductor;
sensing the occurrence of each half cycle of the AC energizing signal on the conductor; and
phase shifting by 180° the predetermined regular relationship of periodic connection of the load to the conductor upon the occurrence of each subsequent half cycle of the AC energizing signal.

19. An invention as defined in claim 18 further comprising the steps of:
connecting the load to the conductor in a first periodic relationship during half cycles of one polarity of the AC energizing signal;
connecting the load to the conductor in a second periodic relationship during half cycles of the other polarity of the AC energizing signal; and
establishing the first and second periodic relationships in a 180° phase shifted relationship with respect to one another.

* * * * *